United States Patent
Ottens et al.

(10) Patent No.: US 7,411,657 B2
(45) Date of Patent: Aug. 12, 2008

(54) LITHOGRAPHIC APPARATUS AND DEVICE MANUFACTURING METHOD

(75) Inventors: Joost Jeroen Ottens, Veldhoven (NL); Noud Jan Gilissen, Eindhoven (NL); Martinus Hendrikus Antonius Leenders, Rotterdam (NL); Koen Jacobus Johannes Maria Zaal, Eindoven (NL)

(73) Assignee: ASML Netherlands B.V., Veldhoven (NL)

( * ) Notice: Subject to any disclaimer, the term of this patent is extended or adjusted under 35 U.S.C. 154(b) by 249 days.

(21) Appl. No.: 10/990,323

(22) Filed: Nov. 17, 2004

(65) Prior Publication Data

US 2006/0103831 A1    May 18, 2006

(51) Int. Cl.
G03B 27/58    (2006.01)
G03B 27/42    (2006.01)

(52) U.S. Cl. .................................... 355/72; 355/53
(58) Field of Classification Search ............... 355/39, 355/53, 77, 30, 55, 67–76; 356/399–401; 250/548
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 4,999,669 A * | 3/1991 | Sakamoto et al. | 355/53 |
| 5,040,020 A | 8/1991 | Rauschenbach et al. | 355/53 |
| 5,121,256 A | 6/1992 | Corle et al. | 359/664 |
| 5,610,683 A * | 3/1997 | Takahashi | 355/53 |
| 5,711,646 A * | 1/1998 | Ueda et al. | 414/222.13 |
| 5,825,043 A | 10/1998 | Suwa | 250/548 |

(Continued)

FOREIGN PATENT DOCUMENTS

DE    206 607    2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Hung Henry Nguyen
(74) *Attorney, Agent, or Firm*—Pillsbury Winthrop Shaw Pittman, LLP

(57) ABSTRACT

A lithographic apparatus may include an optical element, such as an immersion fluid reservoir, which supported at least in part by a bearing, such as a gas bearing. To enable illumination by the lithographic apparatus of an edge of the substrate, a surrounding structure is provided that surrounds the substrate. A level parameter of the substrate, such as a thickness of the substrate, is measured by a sensor, such as a thickness sensor. By means of an actuator, the substrate table on which the substrate is or will be held is positioned with respect to the surrounding structure, such that a surface of the substrate would be on a substantially same level as a surface of the surrounding structure, thus enabling the optical element to transition from the surface of the substrate to the surface of the surrounding structure and vice versa.

41 Claims, 5 Drawing Sheets

U.S. PATENT DOCUMENTS

| | | | |
|---|---|---|---|
| 5,900,354 A | 5/1999 | Batchelder | 430/395 |
| 6,031,597 A * | 2/2000 | Knirck et al. | 355/53 |
| 6,191,429 B1 | 2/2001 | Suwa | 250/548 |
| 6,236,634 B1 | 5/2001 | Lee et al. | 369/112 |
| 6,529,266 B1 * | 3/2003 | Sandstrom | 355/72 |
| 6,600,547 B2 | 7/2003 | Watson et al. | 355/53 |
| 6,603,130 B1 | 8/2003 | Bisschops et al. | 250/492.1 |
| 7,129,485 B2 * | 10/2006 | Nakasuji et al. | 250/310 |
| 2002/0020821 A1 | 2/2002 | Van Santen et al. | 250/492 |
| 2002/0163629 A1 | 11/2002 | Switkes et al. | 355/53 |
| 2003/0011771 A1 * | 1/2003 | Moriyama | 356/399 |
| 2003/0123040 A1 | 7/2003 | Almogy | 355/69 |
| 2003/0128348 A1 * | 7/2003 | Nishi | 355/53 |
| 2004/0000627 A1 | 1/2004 | Schuster | 250/201.2 |
| 2004/0075895 A1 | 4/2004 | Lin | 359/380 |
| 2004/0080734 A1 * | 4/2004 | Taniguchi et al. | 355/53 |
| 2004/0114117 A1 | 6/2004 | Bleeker | 355/53 |
| 2004/0136494 A1 * | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0189964 A1 * | 9/2004 | Nijmeijer et al. | 355/55 |
| 2004/0207824 A1 | 10/2004 | Lof et al. | 355/30 |
| 2004/0211920 A1 | 10/2004 | Derksen et al. | 250/492.1 |
| 2004/0224265 A1 * | 11/2004 | Endo et al. | 430/322 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0233081 A1 | 10/2005 | Tokita | 427/256 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2005/010611 | 2/2005 |
| WO | WO 2005/024517 | 3/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; Its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\lambda$/NA scaling equations for resolution, depth of focus, and immersion lithography, *J. Microlith., Microfab., Microsyst.* 1 (1):7-12 (2002).

\* cited by examiner

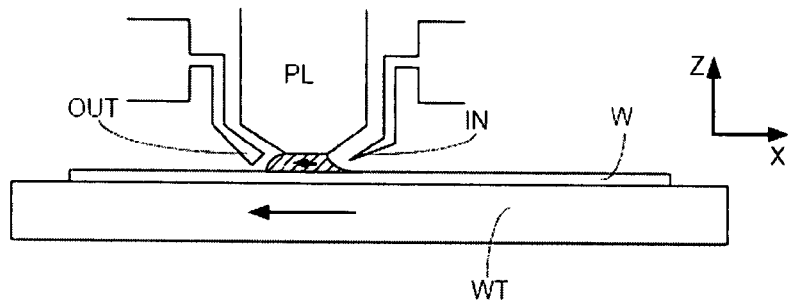
Fig. 2  Prior Art
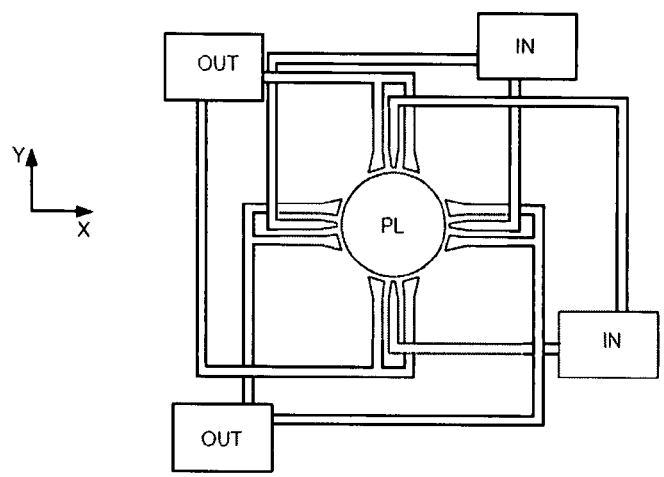
Fig. 3  Prior Art
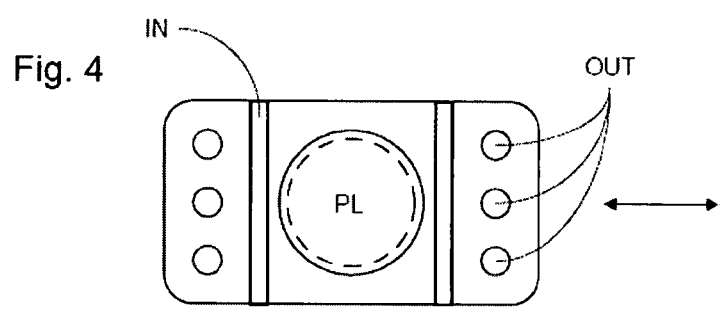
Fig. 4
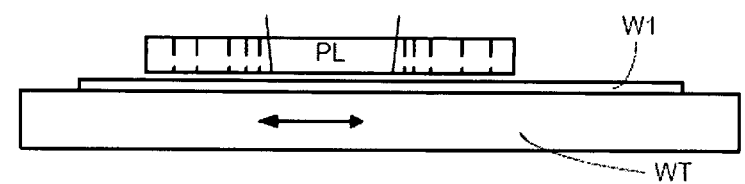

LITHOGRAPHIC APPARATUS AND DEVICE MANUFACTURING METHOD

FIELD

The present invention relates to a lithographic apparatus and device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

Accordingly, it would be advantageous, for example, to increase a production yield of a lithographic apparatus and a device manufacturing method.

According to an aspect of the invention, there is provided a substrate handling system for a lithographic apparatus, comprising a substrate table constructed to hold a substrate;

a surrounding structure surrounding the substrate table;

a sensor configured to determine a level parameter of the substrate;

an actuator configured to move the substrate table with respect to the surrounding structure at least in a direction perpendicular to a surface of the surrounding structure; and a controller configured to drive the actuator to move the substrate table, making use of the level parameter, with respect to the surface of the surrounding structure to a position so that the surface of the substrate, when held on the substrate table, is substantially level with the surface of the surrounding structure.

According to an aspect of the invention, there is provided a device manufacturing method, comprising:

positioning a substrate table with respect to a surface of a surrounding structure, that surrounds the substrate table, to a position where a surface of a substrate held on the substrate table is substantially level with a surface of the surrounding structure; and projecting a patterned beam of radiation onto the substrate.

According to an aspect of the invention, there is provided a computer program comprising program instructions configured to cause an apparatus to execute a method comprising positioning a substrate table with respect to a surface of a surrounding structure, that surrounds the substrate table, to a position where a surface of a substrate held on the substrate table is substantially level with a surface of the surrounding structure.

According to an aspect of the invention, these is provided an optical exposure apparatus, comprising a substrate table constructed to hold a substrate;

a surrounding structure surrounding the substrate table;

a fluid reservoir configured to confine a liquid adjacent the substrate, the substrate table, the surrounding structure, or any combination of the foregoing;

a sensor configured to determine a level parameter of the substrate;

an actuator configured to move the substrate table with respect to the surrounding structure at least in a direction perpendicular to a surface of the surrounding structure; and a controller configured to drive the actuator to move the substrate table, making use of the level parameter, with respect to the surface of the surrounding structure to a position so that the surface of the substrate, when held on the substrate table, is substantially level with the surface of the surrounding structure.

According to an aspect, there is provided a A lithographic apparatus, comprising:

an illuminator configured to condition a radiation beam;

a support constructed to hold a patterning device, the patterning device configured to impart the radiation beam with a pattern in its cross-section to form a patterned radiation beam;

a substrate table constructed to hold a substrate;

a surrounding structure surrounding the substrate table;

a projection system configured to project the patterned radiation beam onto a target portion of the substrate;

a liquid supply system configured to at least partly fill a space between the projection system and the substrate with a liquid, the liquid supply system comprising a liquid confinement structure configured to at least partly confine the liquid within the space;

a sensor configured to determine a level parameter of the substrate;

an actuator configured to move the substrate table with respect to the surrounding structure at least in a direction perpendicular to a surface of the surrounding structure; and a controller configured to drive the actuator to move the substrate table, making use of the level parameter, with respect to the surface of the surrounding structure to a position so that the surface of the substrate, when held on the substrate table, is substantially level with the surface of the surrounding structure.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2 and 3 depict a liquid supply system for use in a lithographic projection apparatus;

FIG. 4 depicts another liquid supply system for use in a lithographic projection apparatus;

DETAILED DESCRIPTION

Figure 1:
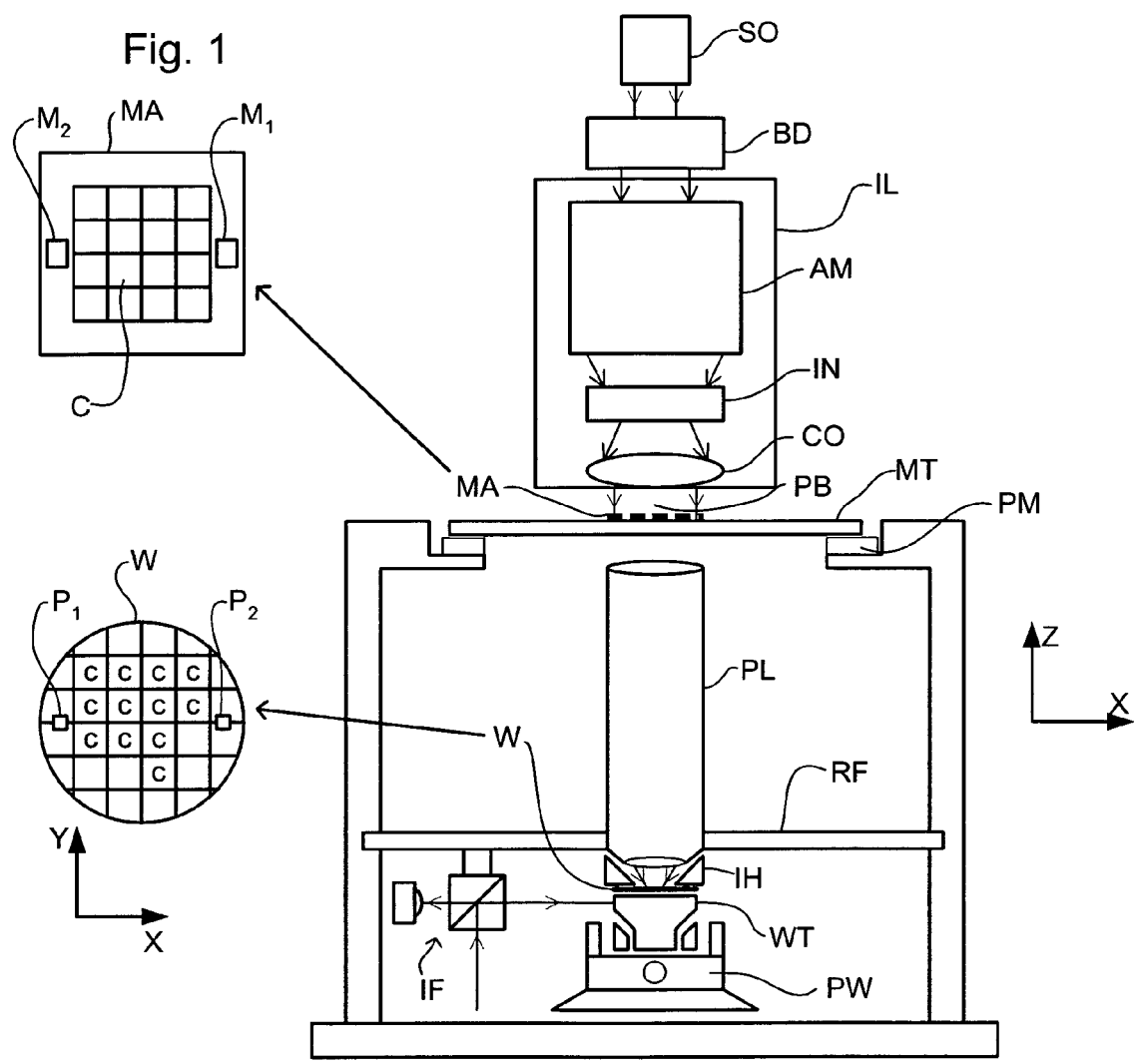
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam PB (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
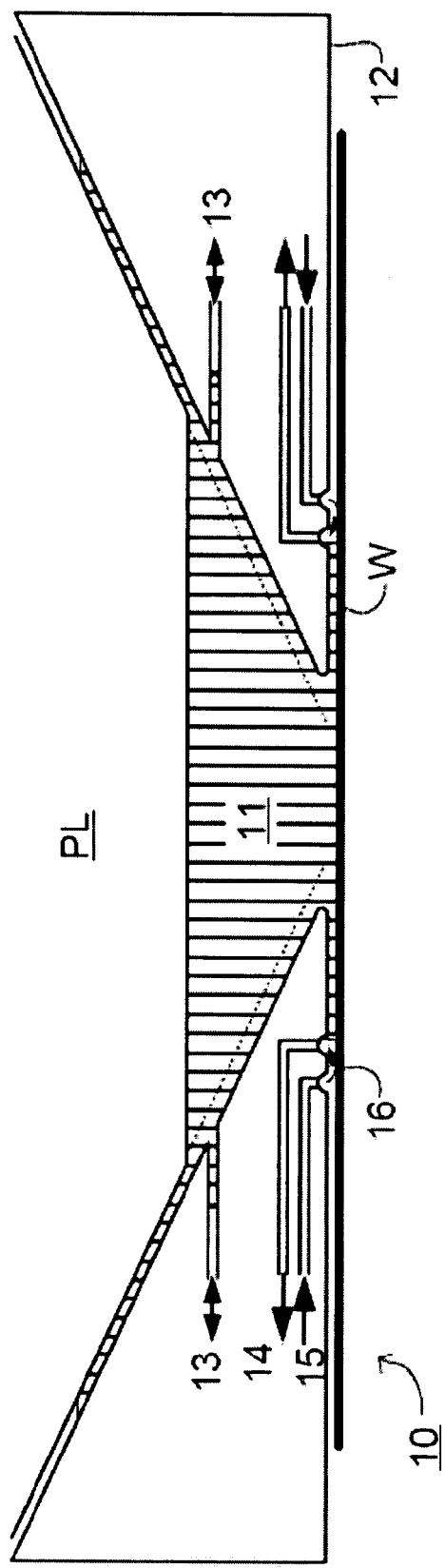
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a system is shown in FIG. 5. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705,783, hereby incorporated in its entirety by reference.

FIG. 5 depicts an arrangement of a reservoir 10, which forms a contactless seal to the substrate around the image field of the projection system so that liquid is confined to fill a space between the substrate surface and the final element of the projection system. A liquid confinement structure 12 positioned below and surrounding the final element of the projection system PL forms the reservoir. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid. It will be understood by the person skilled in the art that other types of seal could be used to contain the liquid.

In the arrangement according to FIG. 5, a gas bearing may be formed in operation by the gas seal 16, the gas bearing guiding the liquid confinement structure 12 with respect to the substrate W. As used herein, a gas bearing may employ air or any other gasses or gas mixtures. The gas bearing enables the passage of the reservoir 10 as shown in FIG. 5 over the substrate W. By displacing the substrate W with respect to the reservoir 10, different portions of the substrate may be brought into contact with the liquid 11 and positioned below the projection system PL for illumination of those portions.

An issue associated with a localized liquid supply system, such as the arrangement as described with reference to FIG. 5, occurs when a portion of the substrate W is to be irradiated which is at or near an edge of the substrate W. To be able to irradiate a portion of the substrate W at or near an edge thereof, the gas seal/bearing 16 is likely to at least partly not be into contact anymore with the substrate W. Therefore, a functioning of the gas seal/bearing 16 may be deteriorated to some extent. Accordingly, a surrounding structure (e.g., surrounding structure M in FIG. 6) may be introduced, a surface of the surrounding structure functioning as a support surface to support the gas seal/bearing 16 in such a situation.

Where a surrounding structure is provided, the difference in level the gas seal/bearing 16 is able to cross is relatively small, in an implementation around 30 to 40 micrometers. This difference is to a large extent determined by the dimensions of the gap between the substrate W and the liquid confinement structure 12. In general, however, a tolerance of thickness of the substrate W is larger than the level difference the gas seal/bearing is able to cope with. Currently, a thickness tolerance of substrates is in the range of about +/−25 micrometers, and in addition thereto a number of layers might have been established on the substrate W during a production process, such as an integrated circuit manufacturing process. The thickness of such layers will probably be between about 0 to 20 micrometers. As a result thereof, a total tolerance band of the thickness of a substrate will in a current implementation amount to approximately a range of about −25 micrometers to +45 micrometers, thus resulting in a total tolerance band of about 70 micrometers. This total tolerance exceeds the level difference which the gas seal/bearing 16 is able to cope with.

As a result of this discrepancy, illumination of the substrate W may take place in a center zone of the substrate only, thus not illuminating the substrate surface near its edge, with a downside that a significant part of the substrate W may not effectively be used during production. Alternatively, a selection of appropriate substrates may be implemented, i.e., only substrates having a thickness within a tolerance acceptable for the lithographic apparatus, and in particular acceptable for the gas seal/bearing, are provided to be processed by the lithographic apparatus. A downside of this selection process is that it may reduce production yield of the lithographic apparatus, as substrates having a thickness outside the acceptable tolerance are not allowed to be processed and thus have to be taken out of the production process in which the lithographic apparatus is used. This may result in a waste of material, a waste of time of apparatuses processing a substrate that will be disqualified because of its thickness, etc.

Figure 6:
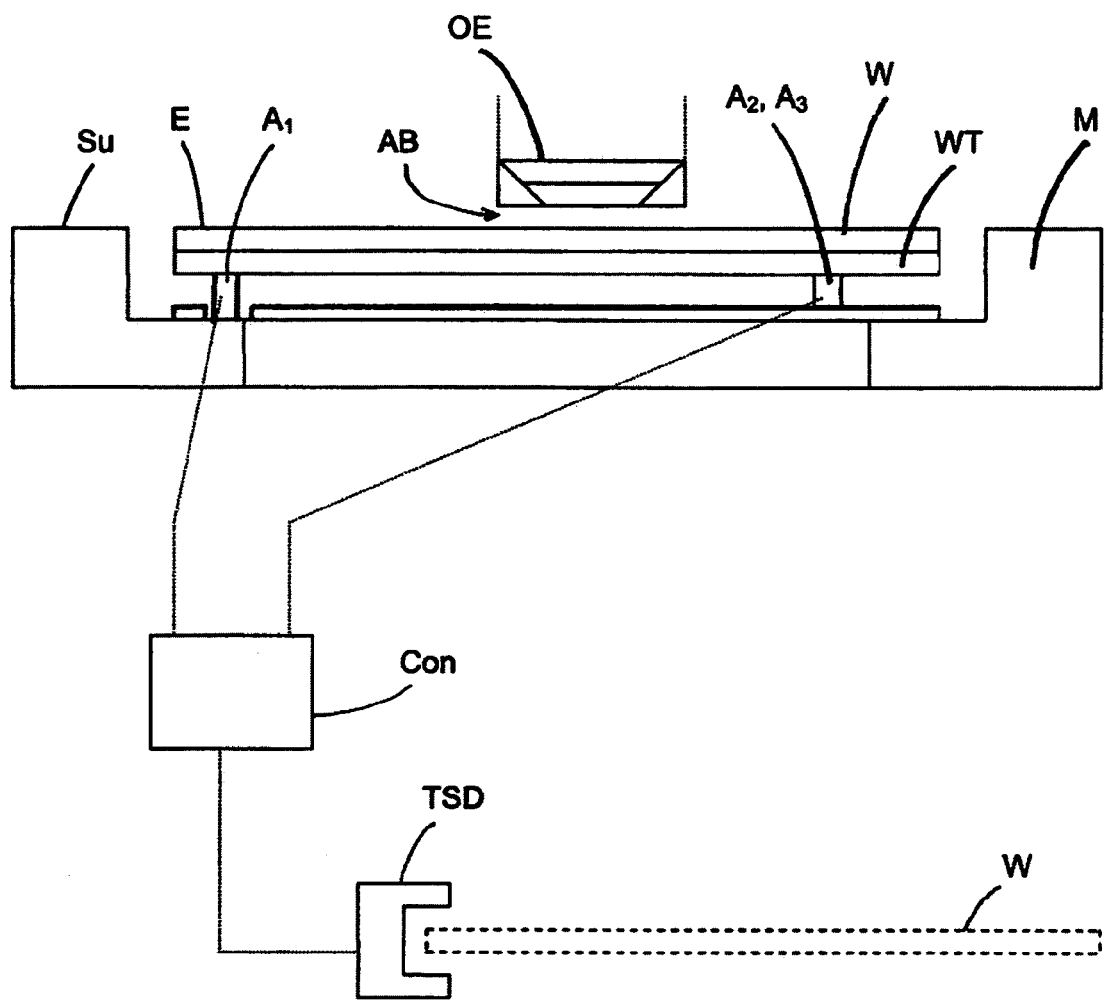
FIG. 6 depicts a part of a lithographic apparatus according to an embodiment of the invention.

FIG. 6 schematically depicts a substrate table WT carrying a substrate W, such as a wafer. The substrate table WT in this embodiment is supported by an actuator comprising actuators A1, A2 and A3. The substrate table WT is surrounded by a surrounding structure M, comprising, for example, a mirror block for an interferometer or encoder and/or one or more transmission image sensors. In an embodiment, the surrounding structure may comprise two transmission image sensors, one integrated lens image aberration sensor (ILIAS), four zero sensors to link a position sensor IF to one or more long stroke positioner encoders, one spot sensor, one closing plate to contain liquid with a liquid confinement structure when the substrate table is not present under the projection system, and one cover plate which fills up holes or gaps between sensors. FIG. 6 further depicts an optical element OE, which in this embodiment comprises the arrangement as depicted in FIG. 5. The optical element OE in this embodiment forms part of or interacts with the projection system of the lithographic apparatus. The optical element is, as has been described with reference to FIG. 5, bearing on the substrate W by a gas bearing, which in FIG. 5 is referred to by item 16. Instead of a gas bearing, any other type of bearing may be used, such as a liquid bearing or any other movable construction such as a linear motor. Further, the bearing does not necessarily bear the optical element on the substrate, instead, it is also possible that the bearing guides the optical element with respect to any other part of the lithographic apparatus, such as with respect to the substrate table, the surrounding structure, a frame which supports the projection system of the lithographic apparatus, or the projection system, thus providing for a contactless positioning of the substrate with respect to the optical element. Thus, in the context of this document, the term bearing is to be understood as including any type of bearing or other mechanism to enable the substrate, when held by the substrate table, to be moveable with respect to the optical element at, for example, a substantially fixed distance with respect to the optical element.

In an embodiment, the optical element comprises an immersion liquid reservoir, e.g. the reservoir 10 as depicted in FIG. 5, to provide an immersion type lithographic apparatus. In such an embodiment, the bearing comprises a fluid bearing, such as gas (e.g., air) bearing, that provides the effects (such as a sealing of the immersion liquid) as described with reference to FIG. 5.

A level sensor is provided to determine a level parameter of the substrate W to enable a controller CON to drive the actuators A1, A2, and A3 to position the substrate table WT with respect to the surrounding structure M such that the surface of the substrate, when being held by the substrate table, is substantially on a same level as the surface of the surrounding structure. The level parameter may comprise a thickness (as is the case in the embodiment described with reference to FIG. 6) and, in this case, the level sensor comprises a thickness sensor TSD. An advantage of such a configuration is that the thickness can be measured before the substrate is placed on the substrate table, hence enabling the controller to initiate positioning of the substrate table to a desired level before the substrate is even placed on the substrate table. Therefore, no or only little time may be required to perform the leveling after the substrate is placed on the substrate table.

Alternatively, the level sensor may comprise a level difference sensor constructed to measure a level difference between the surface of the substrate and the surface of the surrounding structure and the level parameter comprises the level difference. An advantage of this arrangement is that measurement of the level difference can be performed as a single action, thus obviating a need to measure the level of the substrate and the surrounding structure separately. Further, the level difference may be measured with existing level sensors used for focus control during exposure of the substrate.

In another embodiment, the level sensor comprises a level measurement sensor constructed to measure a level of the surface of the substrate when held by the substrate table and the level parameter comprises the level of the surface of the substrate. In this case, the controller is further provided with a level of the surrounding structure to position the substrate table with respect to the surrounding structure. An advantage of this configuration is that this provides for a simple solution, advantageous in an embodiment wherein only the substrate table is moved by the actuators and the surrounding structure is stationary.

In this document, the wording 'substantially level with' is to be understood as being on substantially a same level, i.e., being on a same level or showing a level difference which is insubstantial for the movement of the optical element with respect to the surfaces of the substrate and of the surrounding structure. In an embodiment, such a level difference amounts to less than about 30 to 40 micrometers (being a thickness of a gap as created by the gas seal 16 in FIG. 5, the gap being between the surface of the substrate and a bottom surface of the liquid confinement structure 12) or less than 10 micrometers.

FIG. 6 further depicts the controller CON, which is connected to the actuators A1, A2 and A3, configured to control operation of the actuators. The controller CON is also provided with an output signal from a level sensor, in this embodiment a thickness sensor TSD which determines a thickness of the substrate W. In FIG. 6, the thickness sensor TSD has been depicted schematically only, more details concerning the exact location and characteristics thereof are described below. The actuators A1, A2 and A3 comprise position actuators constructed to respectively carry out a displacement in a Z direction, i.e., a vertical direction, when instructed by the controller CON, e.g., via a suitable driver (not shown). When the optical element OE moves to an edge E of the substrate W to illuminate a part of the surface of the substrate W at the edge E, then, the optical element OE, and in particular the bearing AB thereof, will be supported partly by the substrate W, and partly by the surface SU of the surrounding structure M. The thickness of the substrate W has been detected by the thickness sensor TSD, in this example, before the substrate W has been positioned on the substrate table WT. The controller CON drives the actuators A1, A2 and A3 to position the substrate table WT with respect to the surface SU of the surrounding structure M to a position where a distance between a surface of the substrate table WT (i.e., the surface of the substrate table WT facing the substrate W) and the surface SU of the surrounding structure M substantially equals the thickness of the substrate as detected by the thickness sensor TSD. Thus, a tolerance in a thickness of the substrate W is compensated for by setting the substrate table WT to an appropriate level such that a surface of the substrate W is at a substantially same level as the surface SU of the surrounding structure M. Thus, a level difference between the level of the substrate W and the surface SU of the surrounding structure M is sufficiently low to enable the gas seal/bearing of the optical element OE to be positioned from being adjacent to the surface of the substrate W to being adjacent to the surface SU of the surrounding structure M and vice versa. Thus, effectively a tolerance in thickness of the substrate W is fully or at least partly compensated for by a positioning of the substrate table WT such that the surface of the substrate W and of the surrounding structure M are set to a substantially same level.

The optical element OE can comprise any part of the projection system, such as a lens, a diaphragm, an optical window, a radiation source, or any other optical element. In an embodiment as described with reference to FIG. 6, the optical element OE comprises the reservoir 10 as has been described in more detail with reference to FIG. 5.

The actuators may comprise any type of positioning actuator, such as a piezo-electric actuator, a pneumatic actuator, a linear motor, a Lorentz actuator, a cam disk or a spindle. An advantage of piezo-electric actuator and a cam disk is their high stiffness, thus increasing the eigen frequencies of the substrate table and increasing the position accuracy thereof. While multiple actuators have been described, a single actuator may be used.

Alternatively or additionally to the arrangement shown in FIG. 6, it is possible that one or more actuators act on the surrounding structure M to position it so as to obtain a substantially level surface comprising the surface of the substrate W on the substrate table WT and the surface of the surrounding structure M. The one or more actuators may be the same actuators that move the substrate table WT or are additional and separate.

As noted, the actuators may be a single actuator configured to compensate for a thickness of the substrate, thus providing for a compensation in a single dimension. Where two or more actuators are provided, it is also possible that the actuators may be configured to compensate for an unflatness of or variation in thickness of the substrate in 2 or more dimensions. In an embodiment, three actuators are provided, preferably located substantially 120° from each other on an imaginary circle substantially concentric with the substrate W held by the substrate table WT. The actuators may be driven individually by the controller to enable an adjustment of the position of the substrate table at each of the actuators individually. In this manner, an error caused by an unflatness of the substrate, e.g. a cross section of the substrate comprising a wedge shape, may be compensated for as the substrate table can be set at a different position at each of the actuators. This may be advantageous in combination with a thickness sensor which is able to determine a thickness of the substrate at two or more distinct locations of the substrate. An example of such thickness sensor is the first stage in a dual stage lithographic apparatus on which leveling measurements are performed. In an embodiment, the locations at the substrate at which the thickness thereof is determined correspond or substantially correspond to the point(s) of application of force by the actuator(s). In this manner, the actuator(s) can be driven so as to position the substrate table as to level the surface of the substrate at the point(s) of application, with the surface of the surrounding structure. In other words, in an embodiment, each actuator is driven by the controller to position the substrate table with respect to the surface of the surrounding structure at a position wherein at two or more distinct locations a distance between the surface of the substrate table and the surface of the surrounding structure, in the direction perpendicular to the surface of the surrounding structure, substantially equals the thickness of the substrate at each of the two or more locations. Thus, making use of two or more actuators, an unflatness resulting in a level difference between a surface of the substrate held by the substrate table and a surface of the surrounding structure, may be compensated for in two or more dimensions.

The actuator is constructed to move the substrate table at least in a direction perpendicular to the surface of the substrate when held by the substrate table. In a typical embodiment, the actuator is constructed to move the substrate table in a vertical direction, however other types of movement of the substrate table are also possible, the movements at least comprising a movement in a direction perpendicular to the surface of the substrate when held by the substrate table or in a direction perpendicular to the surface of the substrate table itself.

Where in this document the term surface is used, in particular in the context of a surface of the substrate, this is to be understood as including a substantially flat surface, however the surface of the substrate may also contain irregularities, level differences, etc, which may be due to, for example, the provisioning of patterns, layers, or other structures on the substrate. Thus, the same remarks as made with regard to the term surface in respect of the substrate may also hold in the context of the surface of the surrounding structure. The surface of the surrounding structure includes a substantially flat or smooth surface, however it is also imaginable that the surface of the surrounding structure comprises irregularities, steps, discontinuities, etc. caused by, for example, the presence of different parts of the surrounding structure, such as the various sensors (TIS, ILIAS, etc) and other elements comprised in the surrounding structure, as described above. In an embodiment, a level difference in the surface of the substrate and/or the surrounding structure amounts to less than 20 micrometers or less than 10 micrometers. In other words, the surface of the substrate and/or the surrounding structure is substantially flat within 20 micrometers or within 10 micrometers, hence providing a surface which is sufficiently smooth, i.e., sufficiently flat not to impede the optical element, in particular the immersion liquid reservoir 10, over the substrate and the surrounding structure.

The bearing discussed herein may comprise a gas bearing and/or a liquid bearing. Applicable gasses may comprise air, synthetic air, nitrogen or any other suitable gas. Applicable liquids may comprise a polarized or non-polarized liquid, comprising, e.g., water, etc. The gas or liquid may be pure or may be a mixture of substances.

The surrounding structure may be comprised in a constructive element of the lithographic apparatus, such as a frame carrying the substrate table WT, however it is also possible that the surrounding structure has no other function in the lithographic apparatus than the provisioning of a surface around the surface of the substrate when positioned on the substrate table. Also, it is possible that the surrounding structure forms part of an optical element of the lithographic apparatus, the optical element, e.g., comprising a mirror block.

The level sensor can comprise any type of level sensor, e.g. an optical distance sensor operating with visible, infrared or ultra-violet radiation, or a mechanical distance sensor. The level sensor may be a separate device in the lithographic apparatus, however it is also possible that an existing measurement device in the lithographic apparatus fulfills the function of the thickness sensor or level sensor, e.g. in other words the thickness sensor or level sensor is comprised in an existing measurement device of the lithographic apparatus. In an embodiment, such an existing measurement device may comprise the leveling measurement stage as described above and in European Patent application 03257072.3, incorporated herein its entirety by reference. For example, leveling measurements may be carried out with a stage at a first position, without immersion liquid (or in more generic terms: immersion fluid), and exposure is carried out with the stage at a second position, where immersion liquid (or in more generic terms: immersion fluid) is present, the thickness of the substrate or the level parameter is advantageously determined at the first position, as leveling measurements are carried out at that stage already. In such a dual stage lithographic apparatus, the leveling measurements can advantageously be carried out along an edge of the substrate, e.g. in a form of a circle in case of a substantially circular substrate. During normal operation, in the dual stage lithographic apparatus, a substrate, e.g. a wafer, is first processed with the substrate table at the first position, e.g. leveling measurements are performed on that particular substrate, and then with the substrate table at the second position, illumination of the substrate takes place. As during the leveling measurements at the first stage the thickness of the substrate may be determined, a positioning of the substrate table WT by the actuators can take place under control of the controller making use of the thickness as determined with regard to that particular substrate when on the first stage. As a result thereof, no or only very limited additional time is required to determining a thickness of the substrate and thus the thickness determination not or substantially not affecting a throughput of the lithographic apparatus. Also, settling time for the positioning of the substrate table should have a negligible influence on a throughput of the lithographic apparatus, as the thickness has been measured when the substrate table with the substrate was e.g. at the first position, thus the thickness is known before positioning the substrate and substrate table at the second position, enabling sufficient time for positioning thereof. Also, it is possible that the level sensor or thickness is a level sensor of a lithographic apparatus having a single stage. In that case, results of a leveling measurement by an existing level sensor of the lithographic apparatus may be used to control a positioning of the substrate table in a manner similarly as described above.

In an embodiment, the thickness sensor may be positioned near a substrate supply, i.e. a substrate input of the lithographic apparatus. In that case, the thickness of the substrate is detected at or near the substrate supply input of the lithographic apparatus. This has an advantage that a substrate having a thickness outside a certain predetermined thickness range may be taken out manually or automatically before being processed further by the lithographic apparatus. This way it can be avoid that the stage or stages of the lithographic apparatus are loaded with a substrate which appears to be outside the level parameter range, e.g. the thickness range.

The controller can comprise any type of controller such as an electronic controller, analog, digital, or a combination thereof, comprising, e.g., a microprocessor, microcontroller, other type of programming device, application specific integrated circuitry, or any other type of programmable device. The actuator can be connected to the controller via any suitable connection, such as an analog line, a digital line, a multiplexed digital line, or any other communication channel.

The arrangement as described with reference to FIG. 6 can be used as part of a lithographic apparatus as mentioned above, however it is also possible that the arrangement as described with reference to FIG. 6 may be used in any immersion optical exposure apparatus, the optical element OE in that case comprising an immersion fluid reservoir such as the reservoir 10 described with reference to FIG. 5.

Figure 7:
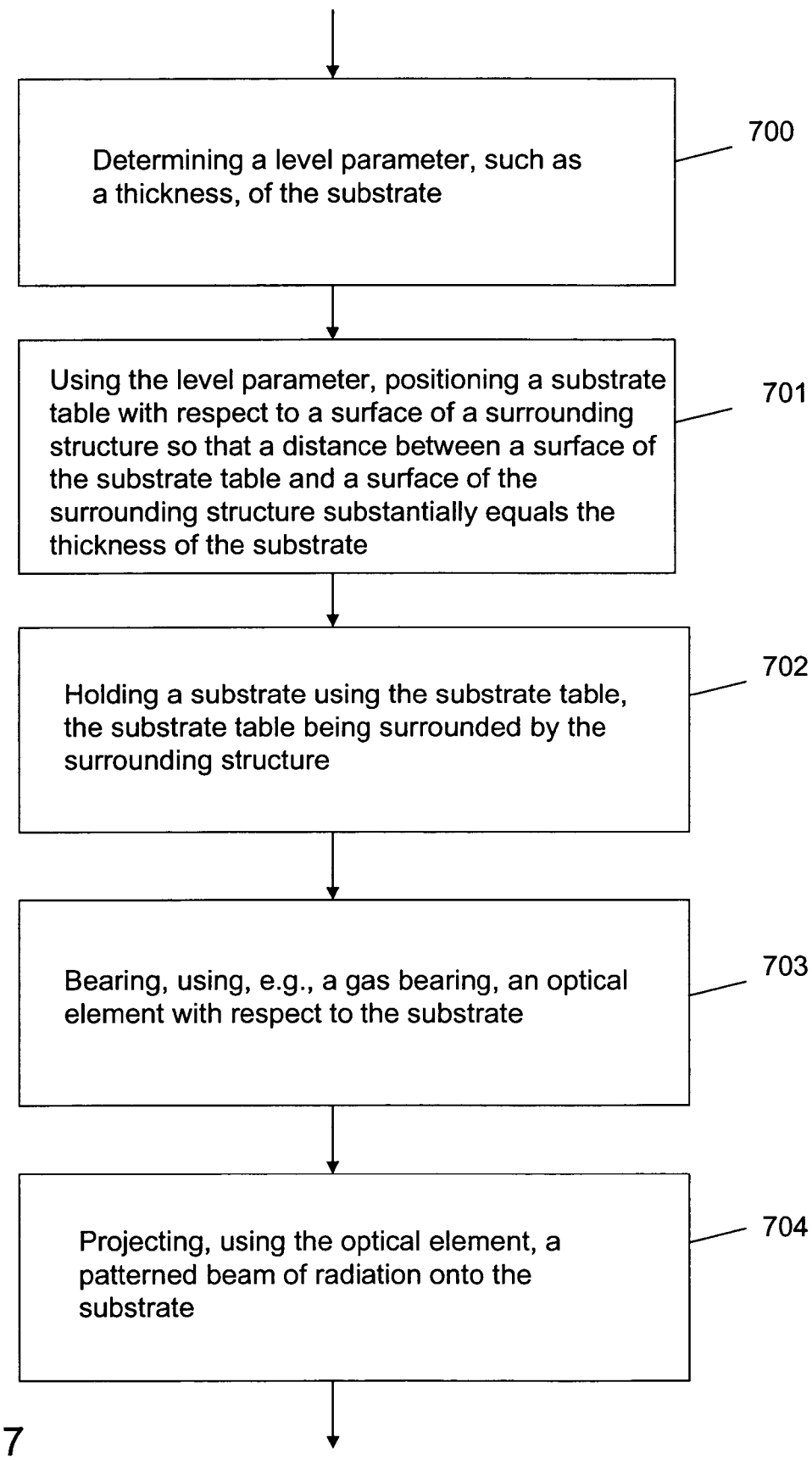
FIG. 7 depicts a flow diagram of the method according to an embodiment of the invention.

An embodiment of the method according to the invention is depicted in FIG. 7. In step 702, a substrate is held by the substrate table, the substrate being surrounded by a surrounding structure. Then, in step 703 an optical element is supported with respect to the substrate by a bearing, such as a gas bearing. In step 704, via the optical element, a patterned beam of radiation is projected onto the substrate. Before step 702 or before step 703, in step 700, a level parameter, such as a thickness of the substrate, is determined. Then, in step 701, using the level parameter, the substrate table is positioned with respect to a surface of the surrounding structure so that a distance between a surface of the substrate table and a surface of the surrounding structure substantially equals the thickness of the substrate. The result would be that the surface of the substrate would thus be substantially level with the surface of the surrounding structure. This distance is to be understood as a distance in a direction perpendicular to the surface of the surrounding structure and/or the substrate. For this embodiment of the method according to the invention, the same or similar advantages, features and embodiments apply as described above with regard to the lithographic apparatus and the projection system according to one or more embodiments of the invention.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, in particular, but not exclusively, to those types mentioned above. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The descriptions above are intended to be illustrative, not limiting. Thus, it will be apparent to one skilled in the art that modifications may be made to the invention as described without departing from the scope of the claims set out below.

The invention claimed is:

1. A substrate handling system for a lithographic apparatus, comprising:
   a substrate table constructed to hold a substrate;
   a surrounding structure surrounding the substrate table;
   a sensor configured to determine a level parameter of the substrate;
   an actuator configured to move the substrate table with respect to the surrounding structure at least in a direction perpendicular to a surface of the surrounding structure; and
   a controller configured to drive the actuator to move the substrate table, making use of the level parameter, with respect to the surface of the surrounding structure to a position so that the surface of the substrate, when held on the substrate table, is substantially level with the surface of the surrounding structure within about 40 micrometers.

2. The system according to claim 1, further comprising an optical element and a bearing configured to guide the optical element with respect to the surface of the substrate.

3. The system according to claim 2, wherein the optical element comprises an immersion fluid reservoir and the bearing comprises a fluid bearing constructed to guide the immersion fluid reservoir with respect to the substrate.

4. The system according to claim 1, wherein the sensor comprises a level difference sensor configured to measure a level difference between the surface of the substrate and the surface of the surrounding structure and the level parameter comprises the level difference.

5. The system according to claim 4, wherein the level difference sensor is provided at a position for scanning an edge of the substrate.

6. The system according to claim 1, wherein the sensor comprises a thickness sensor configured to measure a thickness of the substrate and the level parameter comprises the thickness of the substrate.

7. The system according to claim 6, wherein the thickness sensor is positioned near a substrate supply of the lithographic apparatus and is configured to measure a thickness of the substrate when supplied to the lithographic apparatus.

8. The system according to claim 1, wherein the sensor comprises a level measurement sensor configured to measure a level of the surface of the substrate when held by the substrate table and the level parameter comprises a level of the surface of the substrate.

9. The system according to claim 1, wherein the actuator is selected from the group consisting of a piezo-electric actuator, a pneumatic actuator, a linear motor, a Lorentz actuator, a cam disk and a spindle.

10. The system according to claim 1, wherein the sensor is configured to determine the level parameter of the substrate at a plurality of distinct locations on the substrate.

11. The system according to claim 10, wherein the actuator comprises a plurality of actuators, each of the plurality of actuators configured to be driven individually by the controller.

12. The system according to claim 11, wherein each of the plurality of actuators is driven by the controller to move the substrate table with respect to the surface of the surrounding structure to a position where, at the plurality of distinct locations, the surface of the substrate being held by the substrate table is substantially level with the surface of the surrounding structure.

13. The system according to claim 1, wherein a level difference between the surface of the substrate held by the substrate table and the surface of the surrounding structure is less than 10 micrometers.

14. The system according to claim 1, wherein the surface of the surrounding structure is flat within 20 micrometers.

15. The system according to claim 1, wherein the surface of the surrounding structure is flat within 10 micrometers.

16. A device manufacturing method, comprising:
moving a substrate table with respect to a surface of a surrounding structure, that surrounds the substrate table, to a position where a surface of a substrate held on the substrate table is substantially level with a surface of the surrounding structure within about 40 micrometers; and
projecting a patterned beam of radiation onto the substrate.

17. The method according to claim 16, further comprising guiding an optical element with respect to the substrate and wherein the patterned beam is projected using the optical element.

18. The method according to claim 17, wherein the optical element comprises an immersion fluid reservoir.

19. The method according to claim 16, further comprising determining a level parameter of the substrate and using the level parameter in positioning the substrate table.

20. The method according to claim 19, wherein the level parameter comprises a level difference between the surface of the substrate and the surface of the surrounding structure.

21. The method according to claim 19, wherein the level parameter comprises a thickness of the substrate.

22. The method according to claim 19, wherein the level parameter comprises a level of the surface of the substrate when held by the substrate table.

23. The method according to claim 16, further comprising positioning the substrate table with respect to the surface of the surrounding structure to a position where, at a plurality of distinct locations, the surface of the substrate being held by the substrate table is substantially level with the surface of the surrounding structure.

24. A computer readable medium comprising computer executable instructions configured to cause an apparatus to execute a method, the method comprising:
moving a substrate table with respect to a surface of a surrounding structure, that surrounds the substrate table, to a position where a surface of a substrate held on the substrate table is substantially level with a surface of the surrounding structure within about 40 micrometers.

25. The computer readable medium according to claim 24, further comprising computer executable instructions configured to cause the apparatus to obtain a level parameter of the substrate from a sensor and to instruct an actuator to position the substrate table with respect to the surface of the surrounding structure.

26. An optical exposure apparatus, comprising:
a substrate table constructed to hold a substrate;
a surrounding structure surrounding the substrate table;
a fluid reservoir configured to confine a liquid adjacent the substrate, the substrate table, the surrounding structure, or any combination of the foregoing;
a sensor configured to determine a level parameter of the substrate;
an actuator configured to move the substrate table with respect to the surrounding structure at least in a direction perpendicular to a surface of the surrounding structure; and
a controller configured to drive the actuator to move the substrate table, making use of the level parameter, with respect to the surface of the surrounding structure to a position so that the surface of the substrate, when held on the substrate table, is substantially level with the surface of the surrounding structure within about 40 micrometers.

27. The apparatus according to claim 26, wherein the sensor comprises a level difference sensor configured to measure a level difference between the surface of the substrate and the surface of the surrounding structure and the level parameter comprises the level difference.

28. The apparatus according to claim 27, wherein the level difference sensor is provided at a position for scanning an edge of the substrate.

29. The apparatus according to claim 26, wherein the sensor comprises a thickness sensor configured to measure a thickness of the substrate and the level parameter comprises the thickness of the substrate.

30. The apparatus according to claim 29, wherein the thickness sensor is positioned near a substrate supply of the apparatus and is configured to measure a thickness of the substrate when supplied to the apparatus.

31. The apparatus according to claim 26, wherein the sensor comprises a level measurement sensor configured to measure a level of the surface of the substrate when held by the substrate table and the level parameter comprises a level of the surface of the substrate.

32. The apparatus according to claim 26, wherein the sensor is configured to determine the level parameter of the substrate at a plurality of distinct locations on the substrate.

33. The apparatus according to claim 32, wherein the actuator comprises a plurality of actuators, each of the plurality of actuators configured to be driven individually by the controller.

34. The apparatus according to claim 33, wherein each of the plurality of actuators is driven by the controller to move the substrate table with respect to the surface of the surrounding structure to a position where, at the plurality of distinct locations, the surface of the substrate being held by the substrate table is substantially level with the surface of the surrounding structure.

35. A lithographic apparatus, comprising:
an illuminator configured to condition a radiation beam;
a support constructed to hold a patterning device, the patterning device configured to impart the radiation beam with a pattern in its cross-section to form a patterned radiation beam;
a substrate table constructed to hold a substrate;
a surrounding structure surrounding the substrate table;
a projection system configured to project the patterned radiation beam onto a target portion of the substrate;
a liquid supply system configured to at least partly fill a space between the projection system and the substrate with a liquid, the liquid supply system comprising a liquid confinement structure configured to at least partly confine the liquid within the space;

a sensor configured to determine a level parameter of the substrate;

an actuator configured to move the substrate table with respect to the surrounding structure at least in a direction perpendicular to a surface of the surrounding structure; and a controller configured to drive the actuator to move the substrate table, making use of the level parameter, with respect to the surface of the surrounding structure to a position so that the surface of the substrate, when held on the substrate table, is substantially level with the surface of the surrounding structure within about 40 micrometers.

36. The apparatus according to claim 35, further comprising a bearing configured to guide the liquid confinement structure with respect to the surface of the substrate.

37. The apparatus according to claim 35, wherein the sensor comprises a level difference sensor configured to measure a level difference between the surface of the substrate and the surface of the surrounding structure and the level parameter comprises the level difference.

38. The apparatus according to claim 35, wherein the sensor comprises a thickness sensor configured to measure a thickness of the substrate and the level parameter comprises the thickness of the substrate.

39. The apparatus according to claim 35, wherein the sensor comprises a level measurement sensor configured to measure a level of the surface of the substrate when held by the substrate table and the level parameter comprises a level of the surface of the substrate.

40. The apparatus according to claim 35, wherein the sensor is configured to determine the level parameter of the substrate at a plurality of distinct locations on the substrate.

41. The apparatus according to claim 40, wherein the actuator comprises a plurality of actuators, each of the plurality of actuators configured to be driven individually by the controller.

* * * * *